(12) United States Patent
Okamoto et al.

(10) Patent No.: US 10,566,358 B2
(45) Date of Patent: Feb. 18, 2020

(54) IMAGE SENSOR AND IMAGE CAPTURING APPARATUS

(71) Applicant: CANON KABUSHIKI KAISHA, Tokyo (JP)

(72) Inventors: Kohei Okamoto, Yokohama (JP); Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/893,276

(22) Filed: Feb. 9, 2018

(65) Prior Publication Data

US 2018/0247961 A1    Aug. 30, 2018

(30) Foreign Application Priority Data

Feb. 24, 2017    (JP) .................................. 2017-033848

(51) Int. Cl.
| | |
|---|---|
| *H01L 27/146* | (2006.01) |
| *H04N 9/04* | (2006.01) |
| *H01L 27/28* | (2006.01) |
| *H04N 5/3745* | (2011.01) |
| *H04N 9/07* | (2006.01) |

(52) U.S. Cl.
CPC .. *H01L 27/14603* (2013.01); *H01L 27/14621* (2013.01); *H01L 27/14625* (2013.01); *H01L 27/14627* (2013.01); *H01L 27/286* (2013.01); *H04N 5/3745* (2013.01); *H04N 9/045* (2013.01); *H04N 9/07* (2013.01)

(58) Field of Classification Search
None
See application file for complete search history.

(56) References Cited

U.S. PATENT DOCUMENTS

| | | | |
|---|---|---|---|
| 10,056,418 B2* | 8/2018 | Yamamoto | ............. G02B 5/201 |
| 10,115,753 B2* | 10/2018 | Baek | ...................... H01L 31/047 |
| 10,178,332 B2* | 1/2019 | Hatano | .................... G02B 7/34 |
| 2006/0201546 A1* | 9/2006 | Yokoyama | ........ H01L 27/14621 |
| | | | 136/263 |

(Continued)

FOREIGN PATENT DOCUMENTS

| | | |
|---|---|---|
| JP | 2008-258474 A | 10/2008 |
| JP | 4817584 B2 | 11/2011 |

*Primary Examiner* — Quan Pham
(74) *Attorney, Agent, or Firm* — Canon U.S.A., Inc., IP Division

(57) ABSTRACT

In an image sensor comprising a plurality of imaging pixels, each pixel includes: a microlens for guiding incident light into a corresponding one of the plurality of imaging pixels, a color filter transmitting light of a predetermined wavelength band, a first photoelectric conversion unit for photoelectrically converting the light transmitted through the color filter, and a second photoelectric conversion unit provided below the first photoelectric conversion unit with a predetermined space therebetween. The first photoelectric conversion unit is provided with a first electrode provided to acquire a first signal from a first region of the first photoelectric conversion unit and a second electrode provided to acquire a second signal from a second region different from the first region. A light transmittance of the first photoelectric conversion unit with respect to the predetermined wavelength band is higher than 50%.

9 Claims, 10 Drawing Sheets

(56) References Cited

U.S. PATENT DOCUMENTS

| | | | |
|---|---|---|---|
| 2011/0128430 A1* | 6/2011 | Fossum | H01L 27/1463 348/308 |
| 2014/0362279 A1* | 12/2014 | Takeuchi | H04N 5/3696 348/349 |
| 2015/0244958 A1* | 8/2015 | Ohguro | H04N 5/374 348/277 |
| 2015/0381881 A1* | 12/2015 | Fujii | H04N 5/23212 348/345 |
| 2016/0037117 A1* | 2/2016 | Ono | H04N 5/2173 348/308 |
| 2017/0099449 A1* | 4/2017 | Kang | H04N 5/3765 |
| 2017/0257587 A1* | 9/2017 | Hatano | G02B 7/34 |
| 2017/0358615 A1* | 12/2017 | Baek | H01L 31/047 |
| 2018/0213170 A1* | 7/2018 | Segawa | H01L 27/307 |
| 2019/0019823 A1* | 1/2019 | Ooki | H01L 27/14621 |

* cited by examiner

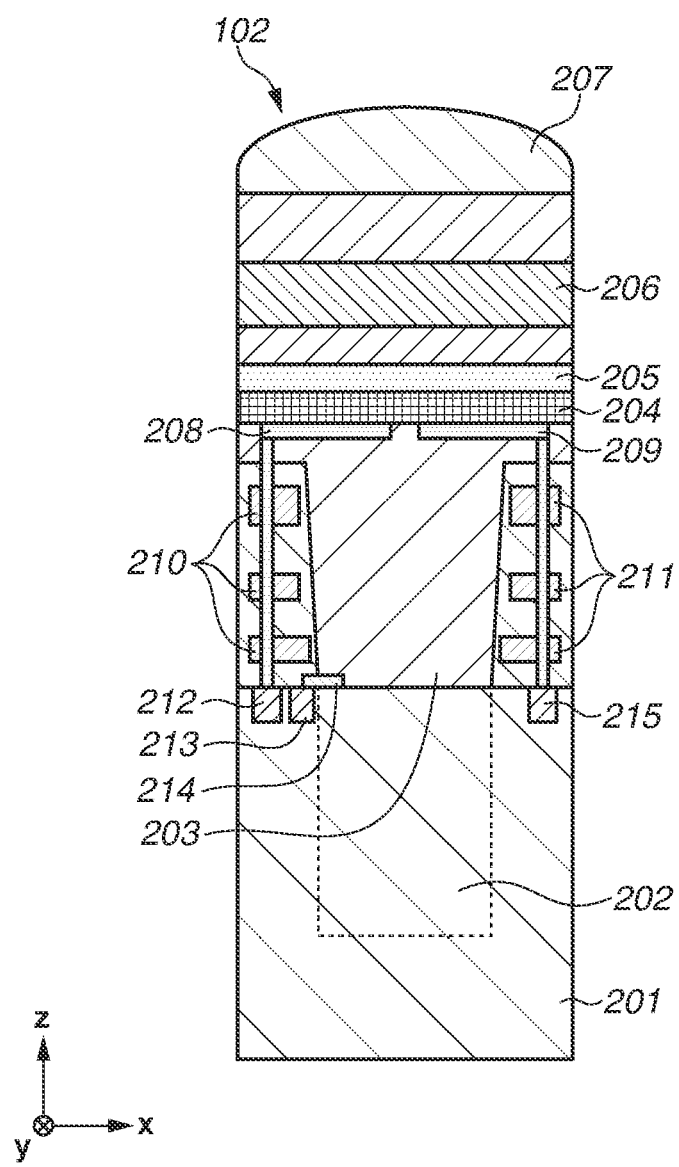

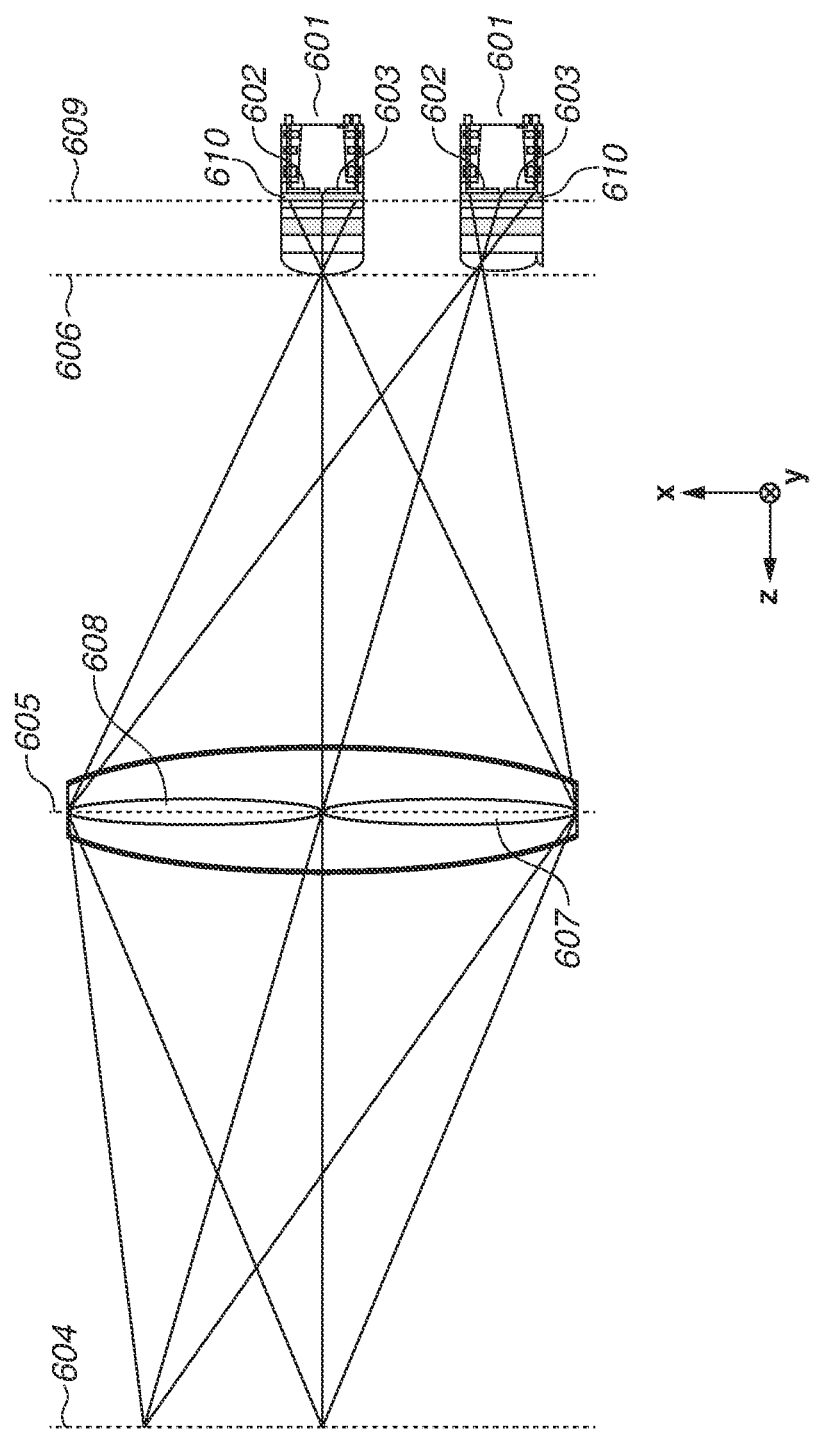

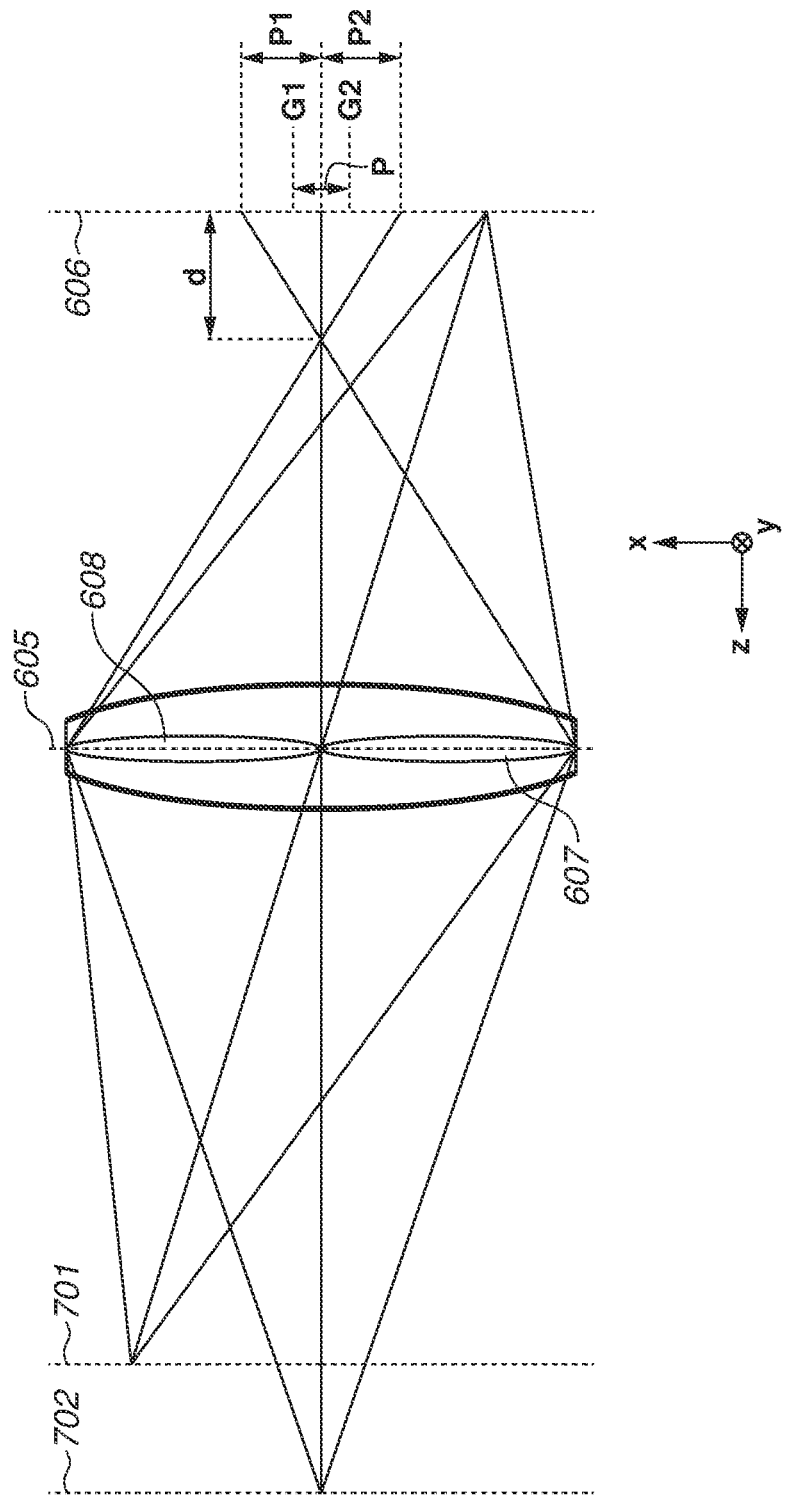

IMAGE SENSOR AND IMAGE CAPTURING APPARATUS

BACKGROUND OF THE DISCLOSURE

Field of the Disclosure

The present disclosure relates to an image sensor and an image capturing apparatus including the image sensor.

Description of Related Art

Recent techniques have discussed improving color reproducibility and high definition using an image sensor in which an organic photoelectric conversion film and a silicon photoelectric conversion unit are stacked. In the discussed image sensor, the silicon photoelectric conversion unit absorbs light of a wavelength band other than a wavelength band of light to be absorbed by the organic photoelectric conversion film, i.e., the silicon photoelectric conversion unit absorbs light of a band of a complementary color.

For example, Japanese Patent Application Laid-Open No. 2008-258474 discusses an image sensor in which cyan and yellow color filters arranged in a checkerboard pattern, a uniform organic photoelectric conversion film that absorbs a green wavelength band, and a silicon photoelectric conversion unit are formed in this order from the top. In such a case, light of the green wavelength band among light transmitted through the cyan and yellow color filters is absorbed in the organic photoelectric conversion film and converted into a signal, whereas light of blue and red wavelength bands which is not absorbed at the organic photoelectric conversion film is absorbed in the silicon photoelectric conversion unit and converted into signals. Japanese Patent No. 4817584 discusses an image sensor including no color filter. In the image sensor, an organic photoelectric conversion film and second and third photoelectric conversion units are formed. The organic photoelectric conversion film as a first photoelectric conversion unit is disposed above the second and third photoelectric conversion units and exhibits absorption with respect to light of the green wavelength band. The second and third photoelectric conversion units are formed below the organic photoelectric conversion film and above a silicon substrate. Light of the blue wavelength band and light of the red wavelength band which are transmitted through the organic photoelectric conversion film travel into the second photoelectric conversion unit. The light of the blue wavelength band, however, has a higher absorption coefficient than that of the light of the red wavelength band in the silicon substrate, so that the light of the blue wavelength band is absorbed at shallower regions. Then, the light of the red wavelength band is further absorbed at deeper regions. In other words, the light of the blue wavelength band is sufficiently absorbed in the second photoelectric conversion unit, and the light of the red wavelength band is mostly absorbed in the third photoelectric conversion unit. The positions and thicknesses of the second and third photoelectric conversion units are determined in such a manner, so that signals across the three-layer photoelectric conversion units are acquired.

SUMMARY

According to an aspect of the present disclosure, an image sensor includes a plurality of imaging pixels configured to detect incident light, wherein the plurality of imaging pixels each includes: a microlens for guiding the incident light into a corresponding one of the plurality of imaging pixels, a color filter transmitting light of a predetermined wavelength band, a first photoelectric conversion unit photoelectrically converting the light transmitted through the color filter, and a second photoelectric conversion unit provided below the first photoelectric conversion unit with a predetermined space, wherein the first photoelectric conversion unit is provided with a first electrode provided to acquire a first signal from a first region of the first photoelectric conversion unit and a second electrode provided to acquire a second signal from a second region of the first photoelectric conversion unit, and wherein a light transmittance of the first photoelectric conversion unit with respect to the predetermined wavelength band is higher than 50%.

Further features and advantages of the present disclosure will become apparent from the following description of exemplary embodiments with reference to the attached drawings.

BRIEF DESCRIPTION OF THE DRAWINGS

FIG. 2 is a cross-sectional view illustrating the internal structure of an image capturing pixel of the image sensor according to the exemplary embodiment of the present disclosure.

FIG. 6 schematically illustrates an image sensor and pupil division according to the exemplary embodiment of the present disclosure.

FIG. 7 schematically illustrates the relationship between image deviation amounts and defocus amounts according to the exemplary embodiment of the present disclosure.

DESCRIPTION OF THE EMBODIMENTS

Various exemplary embodiments of the present disclosure will be described in detail below with reference to the accompanying drawings. It should be noted that dimensions, materials, shapes, relative positions, etc. of components described below as examples in the exemplary embodiments are not intended to limit the scope of the present disclosure and can be changed as appropriate depending on the structure of an apparatus to which an exemplary embodiment is applied or various conditions.

Figure 1A:
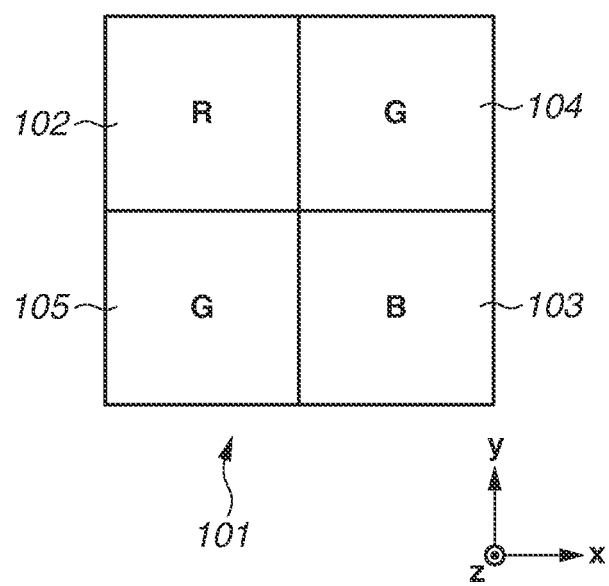
FIG. 1A is a block diagram schematically illustrating a basic image capturing pixel group of an image sensor according to an exemplary embodiment of the present disclosure.

A first exemplary embodiment of the present disclosure will be described in detail below. As an example of an image sensor according to the present exemplary embodiment, a description will be provided of an image sensor with an effective pixel region having a horizontal size of 22.32 millimeter and a vertical size of 14.88 millimeter and including 6000 effective pixels in the horizontal direction and 4000 effective pixels in the vertical direction. FIG. 1A schematically illustrates a basic pixel group 101 having two rows and two columns as a portion of a plurality of image capturing pixels arranged on an image capturing plane of the image sensor. The basic pixel group 101 includes a pixel (R-pixel) 102 and a pixel (B-pixel) 103. The pixel (R-pixel) 102 has a spectral sensitivity for a wavelength band corresponding to red. The pixel (B-pixel) 103 has a spectral sensitivity for a wavelength band corresponding to blue. The basic pixel group 101 further includes two pixels (G-pixel) 104 and 105 each having a spectral sensitivity for a wavelength band corresponding to green.

Figure 1B:
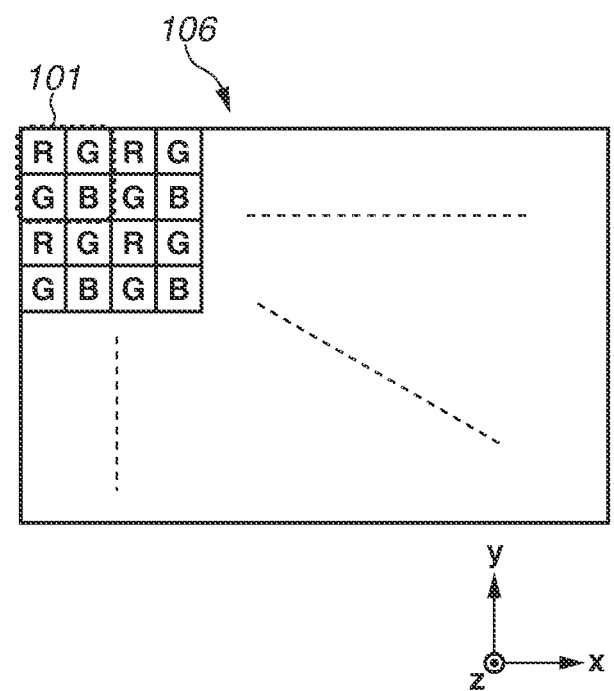
FIG. 1B is a block diagram schematically illustrating an arrangement of the basic image capturing pixel groups.

In FIG. 1B, a pattern diagram illustrates the image sensor 106 of the present exemplary embodiment which is viewed from above the image capturing plane, and the basic pixel groups 101 are two-dimensionally arranged on the image capturing plane. For the purpose of description, the image capturing plane on which the plurality of image capturing pixels is arranged is parallel to the xy-plane, and the direction that is vertical to the xy-plane is the z-direction in the present specification.

The image capturing pixels 102, 103, 104, and 105 of the basic pixel group 101 have a similar basic structure except for a color filter 206, and the image capturing pixel 102 will be focused on for description of the structure of the image capturing pixels 102, 103, 104, and 105. FIG. 2 is a cross-sectional view illustrating the image capturing pixel 102 in FIG. 1A along the zx-plane.

An n-type silicon substrate 201 is provided with a second photoelectric conversion unit 202, formed by ion implantation, on the front surface side of the n-type silicon substrate 201. As viewed in the z-direction, above the second photoelectric conversion unit 202, a first photoelectric conversion unit 204 is layered to sandwich an optical waveguide 203 between the second photoelectric conversion unit 202 and the first photoelectric conversion unit 204. Continuing in the z-direction, above the first photoelectric conversion unit 204, the color filter 206 and a microlens 207 are provided for converging and guiding light incident into the image capturing pixel 102.

A transfer gate 214 is provided to transfer to a condenser 213 a charge which results from incident light which is photoelectrically converted at the second photoelectric conversion unit 202. The charge transferred to the condenser 213 is converted into a voltage signal. In the present exemplary embodiment, the signal acquired at the second photoelectric conversion unit 202 is used, as an image capturing signal, in image generation processing.

The optical waveguide 203 is structured in such a manner that a real part of the refractive index inside the optical waveguide 203 is higher than that of the outside of the optical waveguide 203 in the xy-plane. The inside of the optical waveguide 203 is transparent for visible light and may be made of any highly-refractive materials that satisfies the above-described relationship of the real part of the refractive index. Such examples include, but are not limited to, an optical waveguide with the outside made of SiOx and the inside made of SiNx.

On an upper part of the first photoelectric conversion unit 204, an upper transparent electrode 205 is formed so as to extend across nearby pixels. On a lower part of the first photoelectric conversion unit 204, lower transparent electrodes 208 and 209 are formed which are electrically separated from the nearby pixels. The electrode patterns of the lower transparent electrodes 208 and 209 are equivalent to the dividing and patterning of a pupil region of an incident optical system. Then, light belonging to incident luminous fluxes transmitted through the different pupil regions which are divided and patterned are photoelectrically converted into charges, and the charges can be output as electric signals through the corresponding one of the lower transparent electrodes 208 and 209. The electric signals from the different lower transparent electrodes 208 and 209 correspond to luminous fluxes which are optically pupil-divided. In the present exemplary embodiment, the signals acquired at the first photoelectric conversion unit 204 are used in focal point detection processing using a phase different method through pupil division.

Various materials that has light-reception sensitivity for the visible light band, such as an organic photoelectric conversion film or quantum dot film, are applicable to the first photoelectric conversion unit 204, and, in particular, a material having a constant light-reception sensitivity for the visible light band is desirable. In the present exemplary embodiment, the first photoelectric conversion unit 204 includes an organic photoelectric conversion film, and a layer structure for efficiently transporting the charges to the electrodes is formed, such as an electron block layer formed between the first photoelectric conversion unit 204 and the upper transparent electrode 205 and a hole block layer between the first photoelectric conversion unit 204 and the lower transparent electrodes 208 and 209. The first photoelectric conversion unit 204 is a common film layer which is common to a plurality of pixels.

On the respective sides of the optical waveguide 203, electric wiring portions 210 and 211 are provided. The electric wiring portion 210 and 211 are used to transmit to each element a signal for reading a signal charge or a signal for switching. The electric wiring portions 210 and 211 are covered by a low-refractive material of the outside of the optical waveguide 203 and insulated. The electric wiring portions 210 and 211 include a function of shielding the elements provided to the n-type silicon substrate 201, such as the condenser 213, from light.

In the present exemplary embodiment, the thickness of the first photoelectric conversion unit 204 is set in such a manner that 50% or less of light incident on the first photoelectric conversion unit 204 (in particular, visible light) is absorbed (transmittance is higher than 50%) while the rest is transmitted through the first photoelectric conversion unit 204. Assume that, in the present exemplary embodiment, the thickness is set in such a manner that a predetermined ratio of such a light absorption is adjusted to about 10%. The setting is not limited to the above-described setting, and the ratio of the light transmitted through the first photoelectric conversion unit 204 to the light absorbed by the first photoelectric conversion unit 204 may be determined as the predetermined ratio. This is to generate an image to be recorded from the signal acquired from the first photoelectric conversion unit 204 and to conduct focal point detection from the signal acquired from the second photoelectric conversion unit 202 situated below the first photoelectric conversion unit 204. The use in focal point detection is only temporary, so the absorption rate at the first photoelectric conversion unit 204 is set to 50% or less. Thus, the ratio of the light absorbed by the first photoelectric conversion unit 204 is desirably determined based on the purpose of use of the signals output from the respective photoelectric conversion units.

In the present exemplary embodiment, the signal output from the first photoelectric conversion unit 204 is used, for example, by adding the output signals of nine nearby image capturing pixels of the same color. Thus, even if only about 10% of light is absorbed at the first photoelectric conversion unit 204, a sufficient signal intensity is obtained by the addition. By contrast, the second photoelectric conversion unit 202 can receive about 90% of light from the color filter 206 when scattering and minor absorption are ignored. Thus, a high-resolution image is acquirable with the second photoelectric conversion unit 202 without the addition of the signals of the nearby pixels of the same color. Here, the resolution becomes lower than that of the images acquired from the second photoelectric conversion unit 202 due to addition of the signal output from the first photoelectric conversion unit 204. Specifically, an area of one pixel of the first photoelectric conversion unit 204 is larger than an area of one pixel of the second photoelectric conversion unit 202.

While the number of pixels to be used for the addition (unit of addition) is nine in the present exemplary embodiment, a similar advantage is produced by using two or more pixels for the addition. Here, setting the reciprocal of the transmittance through the first photoelectric conversion unit 204 and the reciprocal of the number of pixels to be used for the addition to be substantially equal can adjust the signals output from the first photoelectric conversion unit 204 and the second photoelectric conversion unit 202 to a uniform output level.

Figure 10:
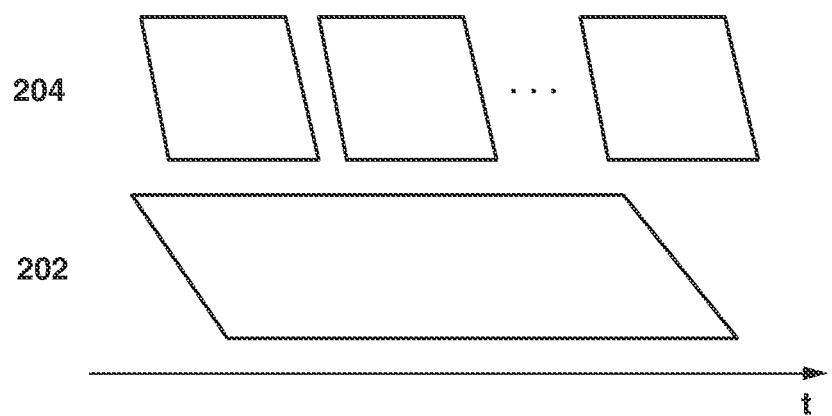
FIG. 10 is a schematic diagram illustrating how signals are acquired from a first photoelectric conversion unit and a second photoelectric conversion unit.

FIG. 10 is a schematic diagram illustrating how signals are acquired from the first photoelectric conversion unit 204 and the second photoelectric conversion unit 202. In the present exemplary embodiment, the frame rate which is the cycle of acquiring a signal from the first photoelectric conversion unit 204 is different from the frame rate which is the cycle of acquiring a signal from the second photoelectric conversion unit 202. More specifically, the cycle of acquiring a signal from the first photoelectric conversion unit 204 is set faster than the cycle of acquiring a signal from the second photoelectric conversion unit 202. In this way, concurrently with focal point adjustment and image capturing (moving image capturing or live view (LV) image capturing) at a high frame rate with low resolution, image capturing (still image capturing) at a slightly low frame rate with relatively high resolution is realized at a timing during that time. In other words, use of the signal from the first photoelectric conversion unit 204 in LV image capturing or moving image capturing enables constant high-speed focal point adjustment and execution of still image capturing using the signal from the second photoelectric conversion unit 202.

Figure 3:
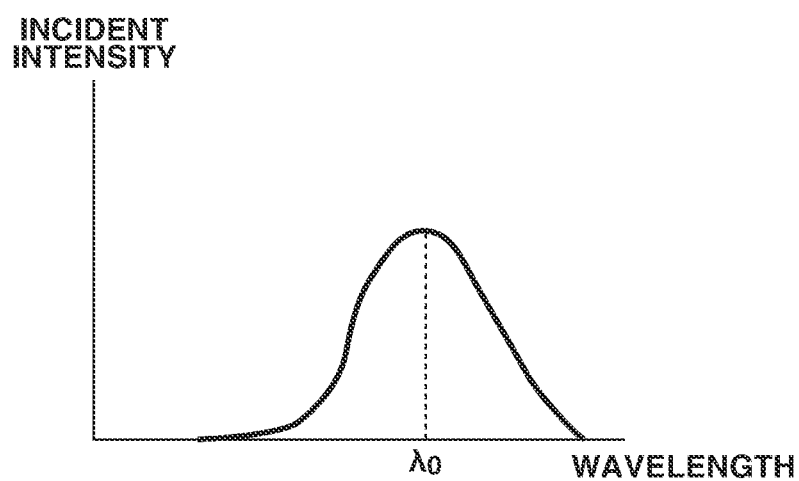
FIG. 3 is a graph illustrating the wavelength dependence of the incident intensity of light transmitted through a color filter and entering a first photoelectric conversion unit in the image capturing pixel of the image sensor according to the exemplary embodiment of the present disclosure.

FIG. 3 is a schematic graph illustrating the wavelength dependence of the intensity of light transmitted through the color filter 206, i.e., transmission spectrum of the color filter 206. For example, the light intensity of a wavelength $\lambda_0$ transmitted through the photoelectric conversion film having a thickness t [nm] is $\exp(-\alpha(\lambda_0) \cdot t)$, where $\alpha(\lambda_0)$ [/nm] is the absorption coefficient of the first photoelectric conversion unit 204 (organic photoelectric conversion film) at the peak wavelength $\lambda_0$ of the spectrum. Thus, the thickness of the photoelectric conversion film can be determined with such a formula. The method is not limited to the above-described method, and a method other than the method focusing on the peak wavelength may be used, such as a determination method based on the transmission ratio of the case of integrating light intensities over the entire wavelength, or a plurality of methods may be used in combination.

As described above, the absorption coefficient $\alpha$ of the photoelectric conversion film depends on the wavelength $\lambda$, so the absorption coefficient for light transmitted through the color filters 206 of R, G, and B varies. By contrast, the thickness of the photoelectric conversion film disposed is basically uniform across the entire image sensor, so that even if the intensity of light incident on the photoelectric conversion films of the R-, G-, and B-pixels is constant, the intensity of light transmitted through each of the photoelectric conversion film differs among the R-, G-, and B-pixels. In other words, the RGB ratio with the light intensity obtained at the photoelectric conversion films differs from the RGB ratio with the light intensity obtained at the second photoelectric conversion units 202.

In such a case, the RGB ratio of the light intensity to be absorbed in the first photoelectric conversion units 204 and the RGB ratio of the light intensity to be absorbed in the second photoelectric conversion units 202 can be adjusted to a similar level or to a close value by, for example, adjustment of the thicknesses of the color filters 206. However, there may be a case in which setting the RGB ratio through adjustment of the thicknesses of the color filters 206 for all the wavelength bands (RGB) is difficult. In such a case, the thickness relationship between two color filters 206 can be set in such a manner that the RGB ratio of two wavelength bands (e.g., G and R) of interest matches in the first photoelectric conversion unit 204 and the second photoelectric conversion unit 202 in terms of the absorption and transmission light intensity.

Alternatively, a method is effective in which a green wavelength band important for focal point detection on the photoelectric conversion film is focused and the ratio between absorption and transmission of the light of this wavelength band in the photoelectric conversion film is set with the thickness of the photoelectric conversion film.

Furthermore, another method is effective in which the film thickness of the first photoelectric conversion unit 204 is set in such a manner that the ratio between absorption and transmission in the photoelectric conversion film of a pixel of a color corresponding to a wavelength band with a low absorption in the absorption spectrum of the photoelectric conversion film is adjusted to a predetermined value (1:9 in the present exemplary embodiment). By contrast, focusing on a wavelength band with high absorption enables light of the wavelength band with a low absorption to be sufficiently transmitted.

Furthermore, focusing on the light of a wavelength band with the highest intensity among light transmitted through each of the color filter 206 of the R-, G-, and B-pixels also enables the ratio between absorption and transmission in the photoelectric conversion film to be set with the thickness of the photoelectric conversion film.

Even if the RGB ratio between the intensities of absorption light and transmission light in the photoelectric conversion film is adjusted through various methods, the RGB ratio can deviate for absorption and transmission. In such a case, a deviation amount is detected in advance, and the deviation amount is given as a correction amount between the output signal from the photoelectric conversion film and the output signal from the second photoelectric conversion unit 202 after the image capturing, thus correcting two images and giving.

Figure 4:
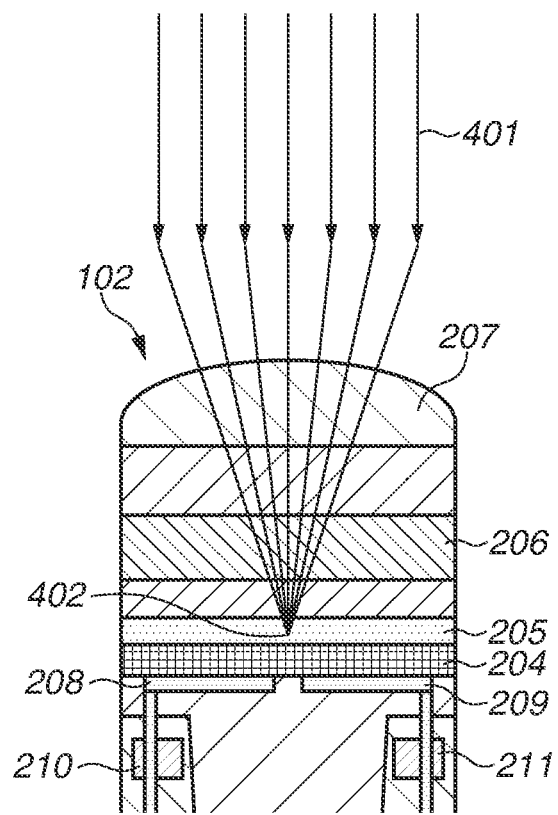
FIG. 4 illustrates a light converging point in the image capturing pixel of the image sensor according to the exemplary embodiment of the present disclosure.

FIG. 4 is a schematic diagram illustrating how light is converged near the center of an image height in the image capturing pixel 102 of the image sensor according to the present exemplary embodiment. FIG. 4 illustrates the case in which parallel light travels to the microlens 207 from the outside of the image capturing pixel 102 as specified by an arrow group 401, i.e., incident light 401. The incident light 401 forms a light converging point 402 in the image capturing pixel 102, and the light converging point 402 is set so as to be positioned near the center of the first photoelectric conversion unit 204 in the z-direction and between the lower transparent electrodes 208 and 209 in the x-direction. As used herein, the term "light converging point" refers to a micro-region including a region with a diameter which is minimized in the case where the cross section of luminous flux is assumed to be circular, and the light converging point is equivalent to, for example, a beam waist region in a Gaussian beam having an intensity distribution 1/e^2. Thus, it can be said that the position of the focal point of the microlens 207 substantially corresponds to the position of the first photoelectric conversion unit 204 in the z-direction.

While the light converging point is set so as to be positioned between the lower transparent electrodes 208 and 209 separated in the x-direction in the present exemplary embodiment, the direction of the separation of the lower transparent electrodes 208 and 209 is not limited to the x-direction. For example, the light converging point is desirably set so as to be positioned in the xy-plane between the lower transparent electrodes 208 and 209 taking part in the phase difference detection in the focused pupil division direction.

Figure 5A:
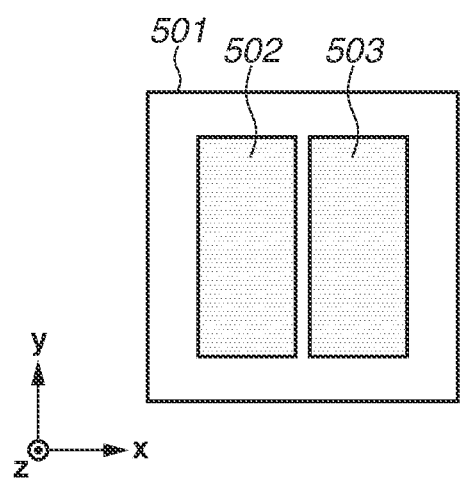
FIGS. 5A, 5B, and 5C each illustrate an example of the shape of a lower transparent electrode of the image capturing pixel of the image sensor according to the exemplary embodiment of the present disclosure or an example of the shape of an upper transparent electrode of the image capturing pixel according to a second exemplary embodiment.
Figure 5B:
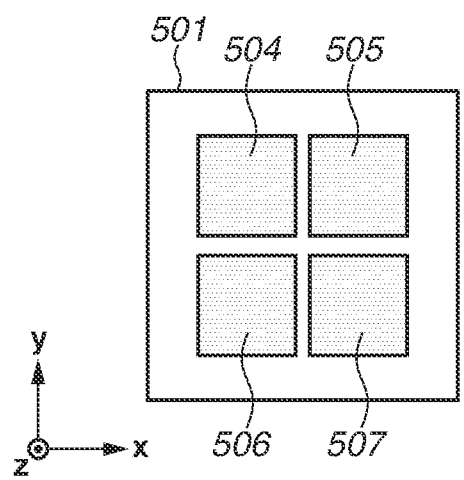
Figure 5C:
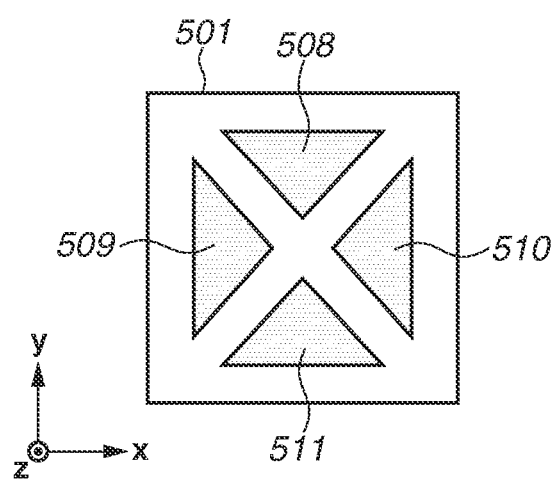

In the present exemplary embodiment, as illustrated in FIG. 5A, the pupil division is performed with two lower transparent electrodes 502 and 503 separated in the x-direction in the pixel region 501 in the xy-plane. Alternatively, the pupil division can be performed in both the x- and y-directions as illustrated by lower transparent electrodes 504, 505, 506, and 507 in FIG. 5B or lower transparent electrodes 508, 509, 510, and 511 in FIG. 5C in the present exemplary embodiment. More specifically, the direction of pupil division, the number of divisions, and the shape of lower transparent electrodes are not limited. Examples of materials of the upper and lower transparent electrodes include but are not limited to fluorine doped tin oxide (FTC)) and tin doped indium oxide (ITO).

An electron shutter mechanism is included in the image sensor according to the present exemplary embodiment to control an exposure time at the second photoelectric conversion unit 202 in the image sensor. In the present exemplary embodiment, assume that a global shutter mechanism is included in the second photoelectric conversion unit 202 of the image capturing pixel 102 of the image sensor to control the exposure time. Specifically, the transfer gate 214 transfers a charge generated at the second photoelectric conversion unit 202 to the condenser 213. The transfer timing is synchronized for a plurality of pixels in the image sensor, thus realizing image capturing using the global shutter. As described above, executing the exposure in the still image capturing using the signal from the second photoelectric conversion unit 202 using the global shutter mechanism enables still image capturing with less rolling shutter distortions even during the moving image capturing using the signal from the first photoelectric conversion unit 204.

FIG. 6 schematically illustrates the correspondence relationship between the image sensor according to the present exemplary embodiment and the pupil division. A line 604 represents the position (object plane) of a subject to be imaged, and an image of the subject is formed on a position on the surface of the image sensor (hereinafter, referred to as image capturing plane 606) through an image capturing optical system positioned at a position 605. Further, a line 609 represents a position in the z-direction of the center of the first photoelectric conversion unit 204 of the image capturing pixel included in the image sensor. For individual pixels of the image sensor, a photoelectric conversion unit corresponding to a lower transparent electrode 602 and a photoelectric conversion unit corresponding to a lower transparent electrode 603 which are separated into two in the x-direction receive luminous fluxes each transmitted through a different one of pupil portion regions among a pupil portion region 607 and a pupil portion region 608.

For each pixel, a signal of a specific photoelectric conversion unit is selected from the photoelectric conversion unit corresponding to the lower transparent electrode 602 and the photoelectric conversion unit corresponding to the lower transparent electrode 603. A parallax image corresponding to a specific pupil portion region from the pupil portion regions 607 and 608 of an image forming optical system is obtained. For example, a signal of the photoelectric conversion unit corresponding to the lower transparent electrode 602 is selected for each pixel so that a parallax image with a resolution of the number of effective pixels corresponding to the pupil portion region 607 of the image forming optical system is obtained. The same applies to the photoelectric conversion unit corresponding to a lower transparent electrode 603.

Furthermore, for each pixel, a signal of the photoelectric conversion unit corresponding to the lower transparent electrode 602 and a signal of the photoelectric conversion unit corresponding to the lower transparent electrode 603 are added so that an image with the resolution of the number of effective pixels can be generated.

In the present exemplary embodiment, as illustrated in FIG. 6, the farther the image capturing pixel is positioned from the center of the image sensor, the more the position of the microlens is decentered toward the center of the image capturing pixel. This is to make an adjustment to a tilt of the direction of a principal ray from the image forming optical system because the direction is tilted more at farther portions from the center of the image sensor.

Next, the relationship between parallax images in terms of the image deviation amount and the defocus amount according to the present exemplary embodiment will be described below.

FIG. 7 schematically illustrates the relationship between the parallax images in terms of the image deviation amount and the defocus amount. Assume that the image sensor (not illustrated) according to the present exemplary embodiment is disposed in the image capturing plane 606 and, as in FIG. 6, that an exit pupil of the image forming optical system is divided into two portions, specifically, the pupil portion regions 607 and 608.

A defocus amount d is defined as follows. The distance from the image forming position of the subject to the image capturing plane is defined as the magnitude |d|. A front-focus state in which the image forming position for the subject is on the subject side from the image capturing plane is defined by a negative sign (d<0). A back-focus state in which the image forming position for the subject is on the opposite side of the subject from the image capturing plane is defined by a positive sign (d>0). The focused state in which the image forming position for the subject is on the image capturing plane is defined as d=0. In FIG. 7, a subject 701 represents an example of the focused state (d=0), and a subject 702 represents an example of the front-focus state (d<0). The front-focus state (d<0) and the back-focus state (d>0) are collectively referred to as a defocus state (|d|>0).

In the front-focus state (d<0), among luminous fluxes from the subject 702, a luminous flux transmitted through the pupil portion region 607 (608) is converged and then diverged over a width P1 (P2) with a position G1 (G2) of the center of gravity of the luminous flux being the center and forms a blurred image on the image capturing plane 606. The blurred image is received by the photoelectric conversion unit corresponding to the lower transparent electrode 601 and the photoelectric conversion unit corresponding to the lower transparent electrode 602, thus forming a parallax image. In this way, the subject 702 is recorded in the position G1 (G2) of the center of gravity as a subject image blurred over the width P1 (P2) on the parallax image generated from the signal of the photoelectric conversion unit corresponding to the lower transparent electrode 601 and the signal of the photoelectric conversion unit corresponding to the lower transparent electrode 602. The blur width P1 (P2) of the subject image is basically increases proportionally as the magnitude |d| of the defocus amount d increases. Similarly, the magnitude |p| of the image deviation amount p (=G1−G2) of the subject image between the parallax images basically increases proportionally as the magnitude |d| of the defocus amount d increases. The same applies to the back-focus state (d>0) except that the direction of the image deviation of the subject image between the parallax images is opposite to that in the case of the front-focus state. In the focused state (d=0), the positions of the centers of gravity of the subject images of the parallax images correspond (p=0), and no image deviation occurs.

To that end, the signal of the photoelectric conversion unit corresponding to the lower transparent electrode 601 and the signal of the photoelectric conversion unit corresponding to the lower transparent electrode 602 are used. In two (plurality of) parallax images obtained in this way, as the magnitudes of the defocus amounts of the parallax images increase, the magnitude of the image deviation amount between the plurality of parallax images increases. Calculating the image deviation amount between the parallax images with correlation calculation using the signal from the first photoelectric conversion unit of the image sensor according to the present exemplary embodiment enables the focal point detection using the focal point detection signal through the phase difference detection method based on pupil division.

A second exemplary embodiment of the present disclosure will be described below. The number of effective pixels and pixel arrangement of an image sensor according to the present exemplary embodiment are similar to those in the first exemplary embodiment. The arrangement of the basic pixel group 101 on the image capturing plane of the image sensor is also similar to that in the first exemplary embodiment, and the basic pixel group 101 is arranged two-dimensionally on the image capturing plane. Details of the internal structure of each image capturing pixel included in the basic pixel group 101 are different from those in the first exemplary embodiment, and thus, the details will be described below.

Figure 8:
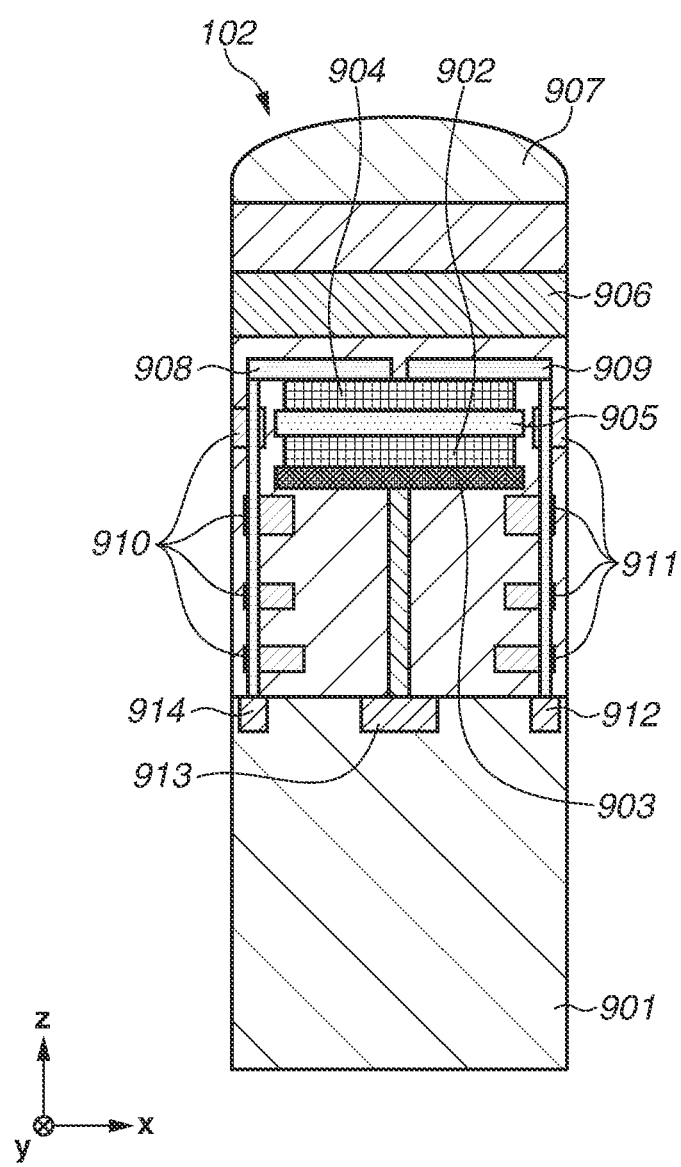
FIG. 8 is a cross-sectional view illustrating the internal structure of the image capturing pixel of an image sensor according to the second exemplary embodiment of the present disclosure.

In the present exemplary embodiment, the basic structure of each image capturing pixel included in the basic pixel group 101 is similar to that of the first exemplary embodiment except for the color filter 206. FIG. 8 is a cross-sectional view illustrating a pixel according to the present exemplary embodiment. In the present exemplary embodiment, a second photoelectric conversion unit 902 is provided as the photoelectric conversion unit corresponding to the second photoelectric conversion unit 202 in the first exemplary embodiment. A common electrode 905 which is a common electrode is disposed between a first photoelectric conversion unit 904 and the second photoelectric conversion unit 902. On an upper surface of the first photoelectric conversion unit 904, upper transparent electrodes 908 and 909 are provided which correspond to the lower transparent electrodes 208 and 209 in the first exemplary embodiment and which are separated and take part in the focal point detection of the phase difference detection method based on pupil division. While the first photoelectric conversion unit 904 and the second photoelectric conversion unit 902 are separated from each pixel in the cross section illustrated in FIG. 8, the first photoelectric conversion unit 904 and the second photoelectric conversion unit 902 are each desirably a common film layer to each pixel in terms of manufacturing.

The upper transparent electrodes 908 and 909 are respectively connected to condensers 914 and 912, and connected to a reading circuit. A lower transparent electrode 903 is disposed on a lower surface of the second photoelectric conversion unit 902. The lower transparent electrode 903 includes a uniform electrode, such as Ti or Cu, and is set so as to transfer a charge generated in the second photoelectric conversion unit 902 to a condenser 913. The lower transparent electrode 903 does not necessarily have to transmit light to a lower portion, and thus, the lower transparent electrode 903 does not necessarily have to be a transparent electrode. The lower transparent electrode 903 also plays a role as a light shielding section for reducing an effect of incident light on each element provided on a silicon substrate 901. In the present exemplary embodiment, assume that the film thickness is set in such a manner that a predetermined percentage of incident light transmitted through the first photoelectric conversion unit 904 is about 90%. In the present exemplary embodiment, the signal output from the first photoelectric conversion unit 904 is used for addition of the output signals from nine nearby image capturing pixels of the same color. Thus, even if only about 10% of light is absorbed at the first photoelectric conversion unit 904, a sufficient signal intensity is obtained through the addition. By contrast, the second photoelectric conversion unit 902 can receive about 90% of light from the color filter 206 when scattering and minor absorption are ignored. Thus, a high-resolution image is acquirable using the second photoelectric conversion unit 902 without the addition of the signals from the nearby pixels of the same color. Setting the predetermined percentage in such a manner enables focal point adjustment and image capturing (moving image capturing or LV image capturing) at high frame rate with relatively slightly low resolution using the first photoelectric conversion unit 904. Furthermore, image capturing (still image capturing) at slightly low frame rate with relatively high resolution is also achieved at a certain timing during the above-described operation.

The light converging point of light in the pixel in the present exemplary embodiment is set so as to be positioned near the center of the first photoelectric conversion unit 904 in the z-direction and between upper transparent electrodes 908 and 909 in the x-direction. In the present exemplary embodiment, the light converging point is set so as to be positioned between the upper transparent electrodes 908 and 909 separated in the x-direction. However, the direction of dividing the upper transparent electrodes 908 and 909 is not limited to the x-direction. Desirably, the light converging point is set so as to be positioned in the xy-plane between the upper transparent electrodes 908 and 909 taking part in the phase difference detection in the focused pupil division direction.

Figure 9:
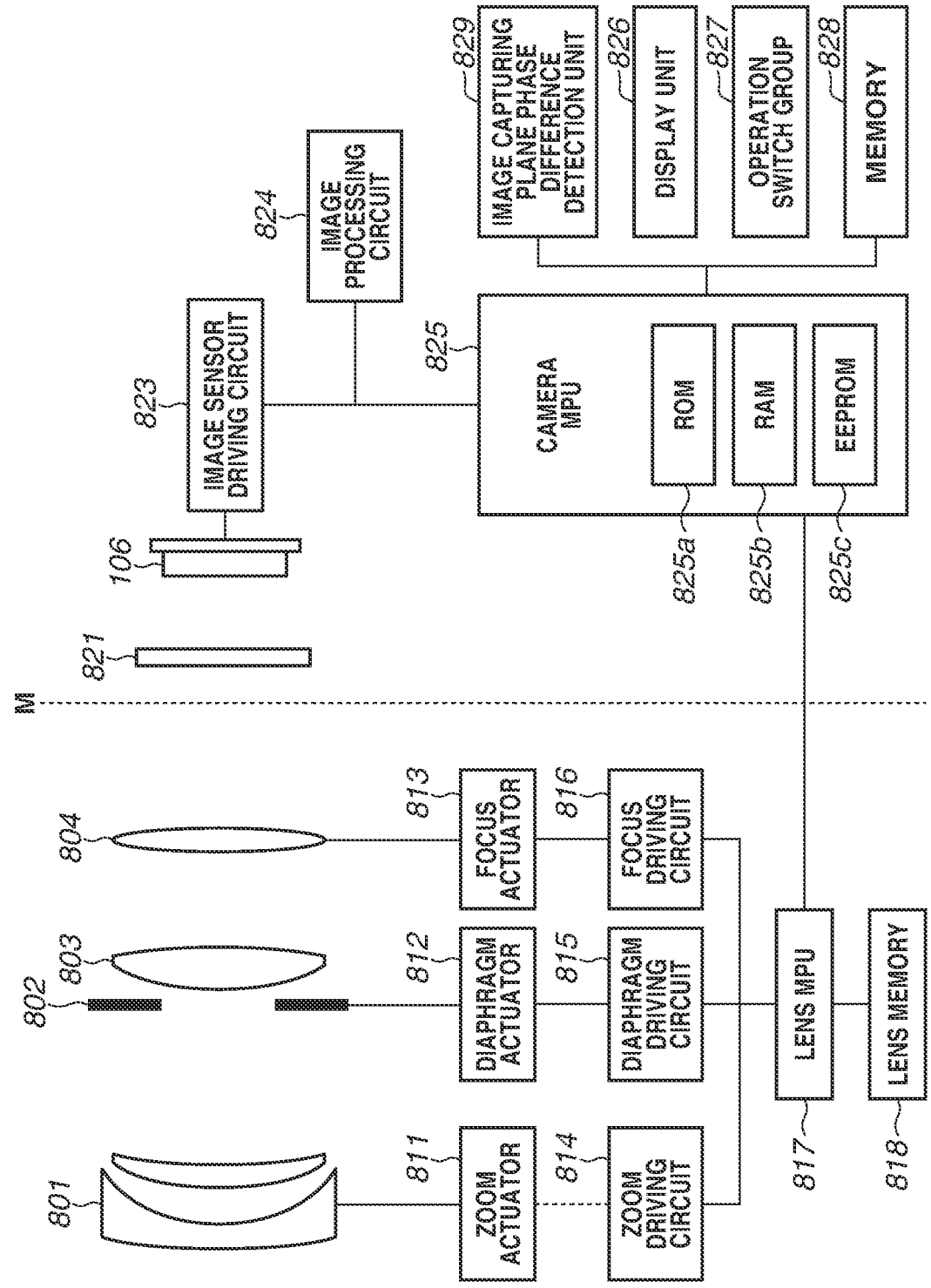
FIG. 9 is a block diagram illustrating an image capturing apparatus according to an exemplary embodiment of the present disclosure.

A third exemplary embodiment of the present disclosure will be described in detail below. A specific example of the structure of an image capturing apparatus according to the present exemplary embodiment will be described below with reference to the drawings. FIG. 9 is a block diagram illustrating an example of the functional configuration of the image capturing apparatus according to the present exemplary embodiment, including an image sensor 106 described in the exemplary embodiments described above. A digital camera is an example of the image capturing apparatus. The image capturing apparatus includes an image sensor and the image capturing function. The image capturing apparatus may be a mobile phone, monitoring camera, or mobile camera. In the image capturing apparatus according to the present exemplary embodiment, two parallax images from the first photoelectric conversion unit 904 of the image sensor 106 are used in the focal point adjustment of the phase difference detection based on pupil division and also used in moving image capturing and LV image capturing at the same time. At this time, signals acquired from lower transparent electrodes the arrangement of which corresponds to each other among the separated lower transparent electrodes of nine nearby pixels of the same color are added. An image obtained by using the signals from the first photoelectric conversion units 904 has decreased resolution because addition processing is executed on the nine pixels to obtain one pixel, but high-speed focal point adjustment is executable. The signal based on light transmitted through the first photoelectric conversion unit 904 and received by the second photoelectric conversion unit 902 positioned below is used in still image capturing. About 90% of the light transmitted through the color filter 206 reaches the second photoelectric conversion unit 902 separated by a predetermined space via an optical waveguide. Thus, a large signal which is about nine times the signal acquired from the first photoelectric conversion unit 904 is acquired from the second photoelectric conversion unit 902, and a high-resolution image is acquired without addition of signals of pixels in the still image capturing. In the still image capturing, global shutter image capturing is performed through an image sensor driving circuit 823 to minimize image distortions caused by, for example, the rolling shutter.

A digital camera according to the present exemplary embodiment is, for example, a lens-interchangeable single-lens reflection camera and includes a lens unit 800 (not illustrated) and a camera body 820. The lens unit 800 is attached to the camera body 820 via a mount M represented by a dotted line in the center of FIG. 9.

The lens unit 800 includes an optical system (a first lens group 801, a diaphragm 802, a second lens group 803, a focus lens group (hereinafter, simply referred to as "focus lens") 804) and a driving/control system. Thus, the lens unit 800 is an image capturing lens including the focus lens 804 and forms an optical image of a subject. The lens unit 800 includes a control unit according to the present exemplary embodiment.

The first lens group 801 is disposed at the leading edge of the lens unit 800 and held movably in an optical axis direction OA. The diaphragm 802 includes not only the function of adjusting the light amount during the image capturing but also the function as a mechanical shutter which controls an exposure time in the still image capturing. The image sensor according to the present exemplary embodiment is provided with the global shutter mechanism for still image capturing using the signals of the second photoelectric conversion unit 902, and thus, the mechanical shutter using the diaphragm does not necessarily have to be used in the still image capturing. For example, if still image capturing is performed using the mechanical shutter while moving image capturing is performed using the signal of the first photoelectric conversion unit 904, the moving image capturing is interrupted during the still image exposure time. To avoid such a case, the still image capturing is performed using the global shutter mechanism provided on the image sensor side so that still images can be captured at the same time without the moving images being affected. The diaphragm 802 and the second lens group 803 are integrally movable in the optical axis direction OA and are moved in conjunction with the first lens group 801, thus realizing a zoom function. The focus lens 804 is also movable in the optical axis direction OA, and the subject distance (focal distance) at which the lens unit 800 focuses changes according to the position. The focal point adjustment for adjusting the focal distance of the lens unit 800 is performed through the control of the position of the focus lens 804 in the optical axis direction OA.

The driving/control system includes a zoom actuator 811, a diaphragm actuator 812, and a focus actuator 813. The driving/control system further includes a zoom driving circuit 814, a diaphragm driving circuit 815, a focus driving circuit 816, a lens microprocessor (MPU) 817, and a lens memory 818.

The zoom driving circuit 814 drives the first lens group 101 and the second lens group 803 in the optical axis direction OA using the zoom actuator 811 to control the viewing angle of the optical system of the lens unit 800. The diaphragm driving circuit 815 drives the diaphragm 802 using the diaphragm actuator 812 and controls the aperture diameter and opening/closing operations of the diaphragm 802. The focus driving circuit 816 drives the focus lens 804 in the optical axis direction OA using the focus actuator 813 to change the focal distance of the optical system of the lens unit 800. The focus driving circuit 816 detects the current position of the focus lens 804 using the focus actuator 813.

The lens MPU 817 executes all calculations and control with respect to the lens unit 800 and controls the zoom driving circuit 814, the diaphragm driving circuit 815, and the focus driving circuit 816. Furthermore, the lens MPU 817 is connected to a camera MPU 825 through the mount M and communicates commands and data. For example, the lens MPU 817 detects the position of the focus lens 804 and transmits a notification of lens position information in response to a request from the camera MPU 825. The lens position information includes information about, for example, the position of the focus lens 804 in the optical axis direction OA, the position and diameter of the exit pupil in the optical axis direction OA in the state in which the optical system is not moved, the position and diameter of a lens frame in the optical axis direction OA which limits the luminous flux of the exit pupils The lens MPU 817 controls the zoom driving circuit 814, the diaphragm driving circuit 815, and the focus driving circuit 816 in response to a request from the camera MPU 825. Optical information necessary for automatic focal point detection is stored in advance in the lens memory 818. The camera MPU 825 controls operations of the lens unit 800 by, for example, executing a program stored in, for example, a built-in non-volatile memory or the lens memory 818.

The camera body 820 includes an optical system (an optical low-pass filter 821 and the image sensor 106) and a driving/control system. The first lens group 801, the diaphragm 802, the second lens group 803, and the focus lens 804 of the lens unit 800 and the optical low-pass filter 821 of the camera body 820 constitute the image capturing optical system.

The optical low-pass filter 821 reduces false colors and moire in captured images. The image sensor 106 is the image sensor described in the above-described exemplary embodiment and includes the structure in which the photoelectric conversion units are layered. In particular, the image sensor 106 according to the present exemplary embodiment includes the pupil division function in the first photoelectric conversion unit 904 and is capable of performing phase difference auto focusing (AF) based on phase difference detection using image data based on the signal from the first photoelectric conversion unit 904. An image processing circuit 824 generates data for phase difference AF and a moving image from image data acquired from the first photoelectric conversion unit 904 of the image sensor 106. The image processing circuit 824 generates a still image from image data acquired from the second photoelectric conversion unit 902 and image data for display and recording from image data acquired from the photoelectric conversion units.

The driving/control system includes the image sensor driving circuit 823, the image processing circuit 824, the camera MPU 825, a display unit 826, an operation switch group 827, a memory 828, and the image capturing plane phase difference detection unit 829.

The image sensor driving circuit 823 controls operations of the image sensor 106, performs analog/digital (A/D) conversion on acquired moving and still image signals, and transmits the converted signals to the camera MPU 825. The image processing circuit 824 executes image processing which is commonly executed in digital cameras, such as gamma conversion, white balance adjustment processing, color interpolation processing, and compressing/encoding processing, on each piece of image data acquired by the image sensor 106. The image processing circuit 824 also generates a signal for phase difference AF.

The camera MPU 825 executes all calculations and control relating to the camera body 820 and controls the image sensor driving circuit 823, the image processing circuit 824, the display unit 826, the operation switch group 827, the memory 828, and the image capturing plane phase difference detection unit 829. The camera MPU 825 is connected to the lens MPU 817 via a signal line of the mount M and communicates with the lens MPU 817 to transmit or receive commands or data. The camera MPU 825 transmits to the lens MPU 817, for example, a lens position acquisition request, a request for driving the diaphragm, focus lens, or zoom by a predetermined driving amount, a request for acquiring inherent optical information about the lens unit 800. The camera MPU 825 includes a built-in read-only memory (ROM) 825a storing a program for controlling camera operations and a built-in random-access memory (RAM) 825b storing variables. The camera MPU 825 further includes a built-in electrically erasable programmable ROM (EEPROM) 825c storing various parameters. The image capturing apparatus according to the present exemplary embodiment may be provided with a communication unit (not illustrated) to be connected to the camera MPU 825. The communication unit is not limited to a wired communication unit, such as a universal serial bus (USB) or local area network (LAN), and may be a wireless communication unit, such as a wireless LAN. The image capturing apparatus according to the present exemplary embodiment is capable of acquiring a control signal from an external device, such as a personal computer and a smart phone, via the communication unit and is also capable of distributing image data and the like based on the acquired control signal.

The display unit 826 includes, for example, a liquid crystal display (LCD), and displays information about, for example, an image capturing mode of the camera, a preview image before image capturing, an image for checking after image capturing, a focus state display image during the focal point detection. The operation switch group 827 includes a power switch, a release (image capturing trigger) switch, a zoom operation switch, and an image capturing mode selection switch. The memory 828 as a recording unit according to the present exemplary embodiment is an attachable and detachable flash memory and records captured images. In the case of acquiring images from two different photoelectric conversion units as a moving image and a still image as in the present exemplary embodiment, the memory 828 can be prepared separating the area of the memory 828 into areas for the moving images and the still images.

The image capturing plane phase difference detection unit 829 performs focal point detection processing through the phase difference detection method using data for focal point detection from the first photoelectric conversion unit, which is acquired from the image processing circuit 824. More specifically, the image processing circuit 824 generates as data for focal point detection a pair of image data from the first photoelectric conversion unit which are generated from luminous fluxes passing through the pair of pupil regions of the image capturing optical system. Then, the image capturing plane phase difference detection unit 829 detects the focal point deviation amount based on the deviation amount of the pair of image data. In such a way, the image capturing plane phase difference detection unit 829 according to the present exemplary embodiment executes phase difference AF (image capturing plane phase difference AF) based on the output of the image sensor 106 using no dedicated AF sensor.

As described above, the digital camera according to the present exemplary embodiment is capable of executing phase difference AF based on the signal acquired from the first photoelectric conversion unit of the image sensor. Furthermore, while the signal acquired from the first photoelectric conversion unit is used in the moving image capturing and LV image capturing, the signal acquired from the second photoelectric conversion unit can be used in the still image capturing.

While exemplary embodiments of the present disclosure have been described, the scope of the invention is not limited to the disclosed exemplary embodiments, and various modifications and changes are applicable within the spirit of the disclosure.

While the present disclosure has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2017-033848, filed Feb. 24, 2017, which is hereby incorporated by reference herein in its entirety.

What is claimed is:

1. An image sensor comprising a plurality of imaging pixels configured to detect incident light, wherein the plurality of imaging pixels each includes:
a microlens for guiding the incident light into a corresponding one of the plurality of imaging pixels,
a color filter transmitting light of a predetermined wavelength band;
a first photoelectric conversion unit for photoelectrically converting the light transmitted through the color filter; and
a second photoelectric conversion unit provided below the first photoelectric conversion unit with a predetermined space therebetween and for photoelectrically converting the light of the predetermined wavelength band transmitted through the first photoelectric conversion unit,
wherein the first photoelectric conversion unit is provided with a first electrode to acquire a first signal from a first region of the first photoelectric conversion unit and a second electrode to acquire a second signal from a second region of the first photoelectric conversion unit,
wherein the second photoelectric conversion unit generates a third signal for image capturing based on the light of the predetermined wavelength band transmitted through the first photoelectric conversion unit,
wherein a light transmittance of the first photoelectric conversion unit with respect to the predetermined wavelength band is higher than 50%, and
wherein resolution of an image generated from the third signals output from the plurality of imaging pixels is higher than resolution of an image generated from the first signals or the second signals.

2. The image sensor according to claim 1,
wherein a position of a focal point of the microlens substantially corresponds to a position of the first photoelectric conversion unit, and
wherein the first signal and the second signal have parallax based on positions of the first electrode and the second electrode.

3. The image sensor according to claim 1,
wherein the first photoelectric conversion unit includes a film layer which is common to the plurality of imaging pixels,
wherein an optical waveguide made of a highly-refractive material is provided between the first photoelectric conversion unit and the second photoelectric conversion unit, and
wherein the first photoelectric conversion unit and the second photoelectric conversion unit are provided via the optical waveguide with the predetermined space.

4. The image sensor according to claim 1,
wherein the first photoelectric conversion unit includes a first film layer which is common to the plurality of imaging pixels,
wherein the second photoelectric conversion unit includes a second film layer which is common to the plurality of imaging pixels,
wherein the first film layer and the second film layer include a common electrode which is common to the plurality of imaging pixels, and
wherein the first photoelectric conversion unit and the second photoelectric conversion unit are provided via the common electrode with the predetermined space.

5. The image sensor according to claim 1, wherein the predetermined wavelength band is a wavelength band of visible light.

6. The image sensor according to claim 1,
wherein the plurality of imaging pixels outputs a plurality of the first signals and a plurality of the second signals being added to signals of a plurality of the first photoelectric conversion units of two or more different imaging pixels among the plurality of imaging pixels.

7. An image capturing apparatus comprising:
an image sensor comprising a plurality of imaging pixels configured to detect incident light, wherein the plurality of imaging pixels each includes:
a microlens for guiding the incident light into a corresponding one of the plurality of imaging pixels,
a color filter transmitting light of a predetermined wavelength band;
a first photoelectric conversion unit for photoelectrically converting the light transmitted through the color filter;
a second photoelectric conversion unit provided below the first photoelectric conversion unit with a predetermined space therebetween and for photoelectrically converting the light of the predetermined wavelength band transmitted through the first photoelectric conversion unit; and
a controller having a processor which executes instructions stored in a memory or having circuitry, the controller being configured to function as:
a focal point detection unit configured to perform focal point detection using a phase difference method based on a first signal and a second signal,
wherein the first photoelectric conversion unit is provided with a first electrode to acquire the first signal from a first region of the first photoelectric conversion unit and a second electrode to acquire the second signal from a second region of the first photoelectric conversion unit,
wherein the second photoelectric conversion unit generates a third signal for image capturing based on the light of the predetermined wavelength band transmitted through the first photoelectric conversion unit,
wherein a light transmittance of the first photoelectric conversion unit with respect to the predetermined wavelength band is higher than 50%, and
wherein resolution of an image generated from the third signals output from the plurality of imaging pixels is higher than resolution of an image generated from the first signals or the second signals.

8. The image capturing apparatus according to claim 7, wherein the controller performs
control on a read cycle of reading a signal from the first photoelectric conversion unit and a read cycle of reading a signal from the second photoelectric conversion unit, and
control in such a manner that the read cycle of reading the signal from the first photoelectric conversion unit is shorter than the read cycle of reading the signal from the second photoelectric conversion unit.

9. The image capturing apparatus according to claim 7, wherein the controller is capable of acquiring a control signal from an external device through communication.

* * * * *